United States Patent [19]

Fan et al.

[11] Patent Number: 5,045,680
[45] Date of Patent: Sep. 3, 1991

[54] INTEGRATED CIRCUIT OPTOELECTRONIC TOGGLE F/F

[75] Inventors: Bunsen Fan, Peekskill; Ricky A. Rand, Somers, both of N.Y.

[73] Assignee: International Business Machines Corporation, Armonk, N.Y.

[21] Appl. No.: 466,902

[22] Filed: Jan. 18, 1990

[51] Int. Cl.$^5$ .............................................. H01J 31/50
[52] U.S. Cl. .................................. 250/213 A; 377/102
[58] Field of Search .............. 250/213 A, 211 J, 551; 377/102; 357/22; 307/311; 365/205, 215

[56] References Cited

U.S. PATENT DOCUMENTS

| | | | |
|---|---|---|---|
| 3,686,645 | 8/1972 | Broido | 365/215 |
| 4,023,887 | 5/1977 | Speers | 350/96.16 |
| 4,223,330 | 9/1980 | Koike et al. | 357/32 |
| 4,295,058 | 10/1981 | Lade et al. | 307/631 |
| 4,390,790 | 6/1983 | Rodriquez | 250/551 |
| 4,521,888 | 6/1985 | Hayashi et al. | 341/200 |
| 4,588,896 | 5/1986 | Abbas | 250/213 A |
| 4,689,793 | 8/1987 | Liu et al. | 250/213 A |
| 4,739,306 | 4/1988 | Tung | 341/136 |

OTHER PUBLICATIONS

"GaAs M.E.S.F.E.T.: A High-Speed Optical Detector", Electron. Lett. 13, 193(1977).
"Optoelectronic Integrated AlGaAs/GaAs p-i-n/Field-Effect Transistor with an embedded, Planar p-i-n Photodiode", Appl. Phys. Lett. 48 (21), May 26 1986, pp. 1461–1463.

Primary Examiner—David C. Nelms
Attorney, Agent, or Firm—Perman & Green

[57] ABSTRACT

A pulse converter includes a set-reset flip/flop, or OP-TOGLE 10, having a pair of cross-coupled switching devices such as transistors Q1, Q2 or logic gates G1, G2. The circuit operates by coupling pulses of optical radiation to each of the devices for causing the devices to alternately toggle between an on-state and an off-state. Optical inputting devices such as photodiodes or photoconductors, or the gates of FET transistors themselves, are integrally formed upon a common substrate with the switching devices for minimizing stray inductive and capacitive reactances to substantially eliminate temporal jitter in an electrical output signal. A pulsed laser source and a fiber optic or optical waveguide provide non-overlapping optical pulses to each of the switching devices. In accordance with one embodiment each of the switching devices is a GaAs MESFET device having a gate terminal comprised of a substantially transparent layer of electrical conductor having an interdigitated geometry and an overlying anti-reflection (AR) coating.

20 Claims, 5 Drawing Sheets

INTEGRATED CIRCUIT OPTOELECTRONIC TOGGLE F/F

CROSS-REFERENCE TO RELATED PATENT APPLICATION

This application is related to a commonly assigned copending U.S. patent application Ser. No. 07/351,686, filed May 15, 1989, now U.S. Pat. No. 4,959,540 and entitled "Optical Clock System for Computers", by B. Fan et al.

FIELD OF THE INVENTION

This invention relates generally to optoelectronic devices and, in particular, to a high-speed, low-jitter toggle Flip-Flop (F/F) device coupled to an optical pulse source for converting an optical pulse into electrical signals.

BACKGROUND OF THE INVENTION

The electrical transmission of fast timing signals introduces timing skew problems resulting from the limited bandwidth associated with the transmission and reception of the electrical signals through conventional electrical cables and transmission lines. One especially deleterious effect of the limited bandwidth is a degradation of fast risetime pulses. As a result, a variation in pulse receiver sensitivity or threshold causes an uncertainty or jitter as to an actual time of the arrival of electrical pulse. If the electrical pulse is being employed as a timing signal in, for example, a high-speed data processing system the presence of pulse jitter is especially detrimental.

FIG. 1 illustrates a simplified diagram of a conventional toggle circuit constructed as a set-reset flip-flop (SR-F/F). The SR-F/F includes two transistors $Q_A$ and $Q_B$ interconnected in a cross-coupled manner as shown. Each transistor is further coupled to a source of operating power ($V_{dd}$) through an associated load resistance $R_A$ and $R_B$. In operation an electrical pulse to INPUT A sets OUTPUT logically HIGH, while an electrical pulse to INPUT B resets the OUTPUT logically LOW. The complementary signal OUTPUT* is LOW when OUTPUT is HIGH and vice versa. One advantage of such a SR-F/F circuit is that the output is always in a known logical state, as is important in the clocking of a computer system. That is, the OUTPUT signal may be employed as a clocking signal for logic circuitry of a computer system.

However, as was previously stated the electrical transmission of fast timing signals introduces timing skew problems resulting from the limited bandwidth associated with the transmission and reception of the electrical signals through conventional electrical cables and transmission lines. That is, if the electrical pulse signals coupled to INPUT A and INPUT B are transmitted through conventional electrical signal transmission means there is a limitation on an upper useable frequency that can be provided to the SR-F/F before the degradation of output pulses and increased output jitter become unacceptable. A problem is created if this upper usable frequency is below a frequency at which it is desired to clock associated logic circuits.

One proposed solution to this problem involves transmitting the input pulses as an optical signal instead of an electrical signal. For example, due to the inherently much wider bandwidth of an optical fiber the transmission of a fast rise time optical pulse through the fiber occurs without significant signal degradation. However, a problem is created when it is required to convert the optical pulse into an electrical signal for interfacing to logic circuits such as the SR-F/F in that optoelectronic circuits generally include electrical switching circuitry coupled to an optical receiver. The receiver typically includes a photosensor followed by several gain stages with output of the gain stages being applied to the associated switching circuitry. A problem with this conventional arrangement relates to the propagation delay between a time light is incident upon the photosensor and a time at which the switching circuit responds by changing state. Another problem relates to temporal jitter resulting from uncertainty in the propagation delay produced by the gain stages proceeding the logic circuitry.

In U.S. Pat. No. 3,686,645, entitled "Charge Storage Flip-Flop" and issued Aug. 22, 1972, Brojdo teaches a semiconductor memory array using a pair of bipolar transistors arranged as a F/F wherein a base of each transistor is connected to a high impedance when a power supply voltage is removed. As the high impedance forces slow decay of charge stored in the transistors, the state of the F/F can be maintained by a pulsed power supply, thereby reducing the average power dissipation of the F/F. Using the photosensitive nature of the transistors, the memory can be written optically by photogenerating charge in the base of one of the transistors, thereby unbalancing the transistors. A laser is employed to address a hologram for providing a desired light pattern for illuminating the memory array. This device specifically uses the low speed nature of the high impedance circuits to integrate the optical signals being applied. Thus, although a F/F circuit configuration is used the application and nature of operation do not address the problem of converting optical pulses into fast rise-time, low jitter electrical logic signals.

In U.S. Pat. No. 4,023,887, entitled "Optical Communication, Switching and Control Apparatus and Systems and Modular Electro-optical Logic Circuits, and Applications thereof" and issued May 17, 1977, Speers discloses optical communication, switching and control apparatus and system, including modular electro-optical logic circuits An optical F—F depicted in FIGS. 38a and 38b and described at Col. 23, lines 3-53 has one optical input and one optical output, and functions basically an optical "repeater" amplifier. It is noted that Speers teaches a binary device wherein the output frequency is one half of the input frequency and individual pulse timing is not preserved. This device is not believed to be suitable for fast rise-time/fall-time, low jitter applications.

The following U.S. Patents are noted of being of general interest. U.S. Pat. No. 4,223,330, entitled "Solid-State Imaging Device", describes a solid-state image pickup device for use in a TV camera and the like. U.S. Pat. No. 4,295,058, entitled "Radiant Energy Activated Semiconductor Switch", describes various power switching circuits using a light sensor such as photodiode coupled to a gate of a depletion-mode FET. U.S. Pat. No. 4,390,790, entitled "Solid State Optically Coupled Electrical Power Switch", relates to optically isolated switching devices such as solid-state relays for power switching or analog switches for signal switching. U.S. Pat. No. 4,521,888, entitled "Semiconductor Device Integrating a Laser and a Transistor", teaches an integrated semiconductor device including a diode laser and a transistor for modulating the laser. U.S Pat. No. 4,739,306, entitled "Calibrated-Weight Balance and an Analog-to-Digital Converter in which the Balance is Employed", discloses a calibrated-weight balance for the construction of very-high-speed analog-to-digital converters (ADC). The circuit includes a multivibrator comprising cross-coupled FETs 15 and 16. However, this Patent does not disclose the provision of optical inputs for driving the multivibrator.

It is thus an object of the invention to provide an optoelectronic pulse converter for converting an optical pulse into an electrical pulse having a fast risetime and a minimum of timing uncertainty.

It is a further object of the invention to provide a timing generation circuit that provides for the transmission of optical pulses of ultrafast risetime through extremely high-bandwidth optical fibers and which further converts these optical pulses into an electrical timing signal having leading and trailing edges exhibiting minimal timing uncertainty.

It is one further object of the invention to provide clock generation circuitry for a high-speed, short cycle time data processor that employs the transmission of optical clock synchronization pulses of ultrafast risetime through extremely high-bandwidth optical fibers and which further converts these optical pulses into an electrical clock signal having a minimal pulse skew.

SUMMARY OF THE INVENTION

The foregoing problems are overcome and the objects of the invention are realized by a high speed clock generator integrated circuit for generating a periodic electrical signal. The circuit operates as a pulse converter and converts optical pulses to electrical pulses.

The pulse converter includes a set-reset flip/flop, or OPTOGLE, having a pair of cross-coupled switching devices such as transistors or logic gates. The converter operates by coupling pulses of optical radiation to each of the switching devices for causing the switching devices to alternately toggle between an on-state and an off-state. Optical inputting devices such as photodiodes or photoconductors, or the gates of FET transistors themselves, are integrally formed upon a common substrate with the switching devices for minimizing stray inductive and capacitive reactances to substantially eliminate temporal jitter in an electrical output signal. A pulsed laser source and a fiber optic or optical waveguide provide non-overlapping optical pulses to each of the switching devices.

In accordance with one embodiment each of the switching devices is a GaAs MESFET device having a gate terminal comprised of a substantially transparent layer of electrical conductor having an interdigitated geometry and an overlying anti-reflection (AR) coating.

In this embodiment the transistors are each constructed of a semiconductor material having a characteristic energy bandgap for absorbing the optical pulse and generate sufficient charge carriers therefrom to induce a current flow though the transistor. The semiconductor material may be comprised of Group III-V material, of silicon, of other Group IV materials such as germanium or of combinations of these materials.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
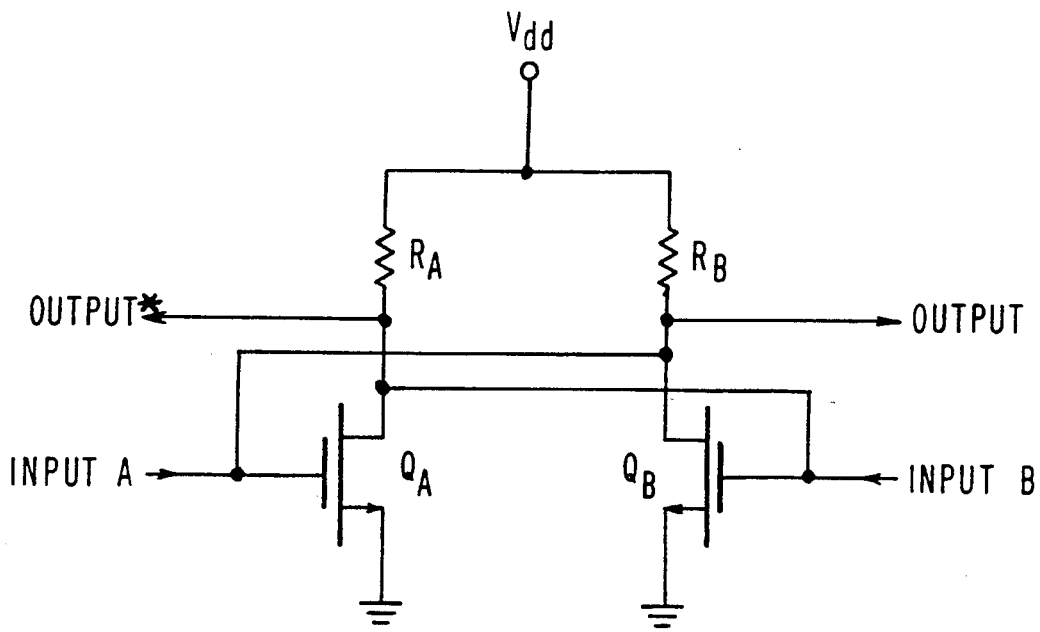
FIG. 1 is a schematic diagram of a conventional two-input, two-output toggle circuit implemented as set-reset F/F.
Figure 2:
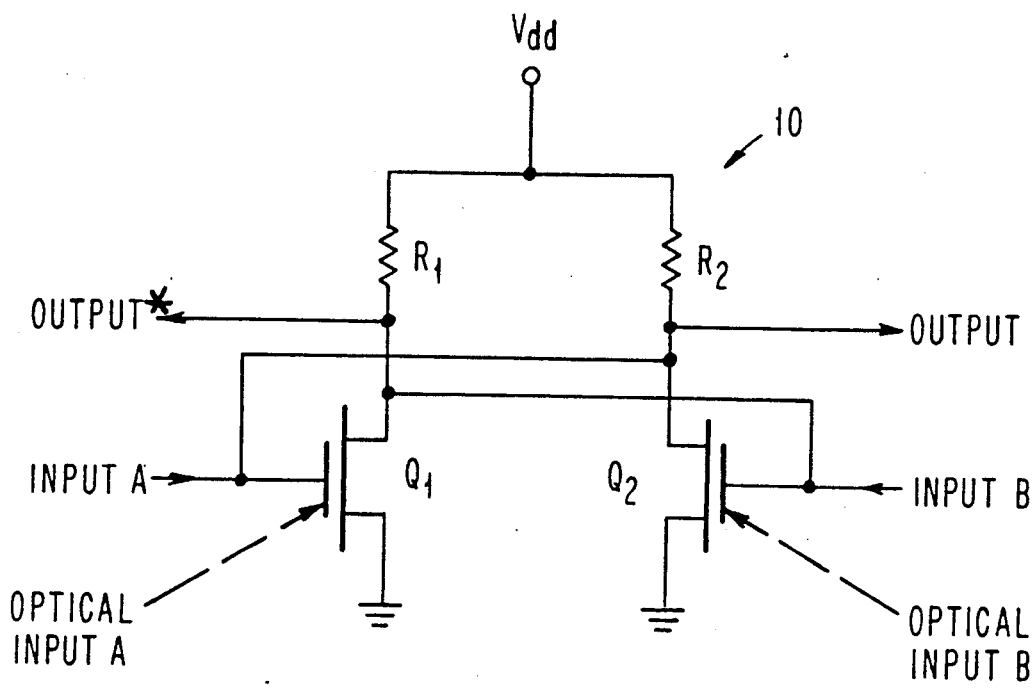
FIG. 2 is a schematic diagram of a toggle circuit also implemented as set-reset F/F but which includes first and second optical inputs for changing the state of the F/F.

Referring now to FIG. 2 there is shown a SR-F/F that operates in accordance with one embodiment of the invention. The SR-F/F is an optically-toggled device and is referred to herein as an OPTOGLE 10. OPTOGLE 10 is constructed in some respects in a similar manner to the circuit of FIG. 1. OPTOGLE 10 includes two transistors $Q_1$ and $Q_2$ having their respective gate terminals interconnected in a cross-coupled manner as shown. Each transistor further has a drain terminal coupled to a source of operating power ($V_{dd}$) through an associated load, such as a resistance $R_1$ and $R_2$, and a source terminal coupled to a common potential. While the OPTOGLE 10 may be implemented in a wide variety of semiconductor device technologies, in a presently preferred embodiment of the invention the transistors are MESFET devices comprised of semiconductor material having a high electron mobility, such as GaAs.

By example, C. Baack et al. in a journal article entitled "GaAs M.E.S.F.E.T.: A High-Speed Optical Detector", Electron. Lett., 13, 193(1977) report a GaAs MESFET photoresponse of less than 75 picoseconds.

In accordance with one embodiment of the invention a region between the source and drain of each MESFET is illuminated with a light pulse of narrow pulsewidth to achieve a high frequency of operation. Preferably the source of the light is a laser source such as a mode-locked gas laser, a mode-locked solid-state laser, or a gain-switched semiconductor diode laser as disclosed in commonly assigned U.S. patent application Ser. No. 07/351,686, filed 5/15/89. Due to the nature of the optical input, the MESFETs have an equivalent fourth port that is highly isolated from the gate, drain and source terminals. This equivalent fourth port is shown schematically in FIG. 2 and is referred to as OPTICAL INPUT A and OPTICAL INPUT B.

If the incident photon energy is greater than the semiconductor bandgap, a large density of charge carriers is generated. These charge carriers produce fast electrical pulses between the drain and source terminals of the FET by means of photoconductivity. In that the optical pulsewidth is preferably much shorter than the charge carrier lifetime, this effect is transient. In general, a risetime of the photoconductive signal is approximately the same as a risetime of the optical pulse while the fall time of the photoconductive signal is a function of the charge carrier lifetime. The photoconductive gain, defined as the number of charge carriers crossing a sample per second divided by the number of photons absorbed per second, is approximately the ratio of optical pulse duration to the transit time of the charge. As a result a large gain may be realized. The light-induced electrical pulse controls the output state of the OPTOGLE 10 in substantially the same manner as the electrical inputs INPUT A and INPUT B, and may be used interchangeably if desired. It should be noted that both electrical and optical inhibit capability is implicit in the circuit in that toggle activity can be inhibited by the application of a long duration pulse, or level, through either the electrical or the optical inputs. In general the transistor gates serve several purposes including providing positive feedback during changes of state and also providing external electrical terminals.

Figure 6:
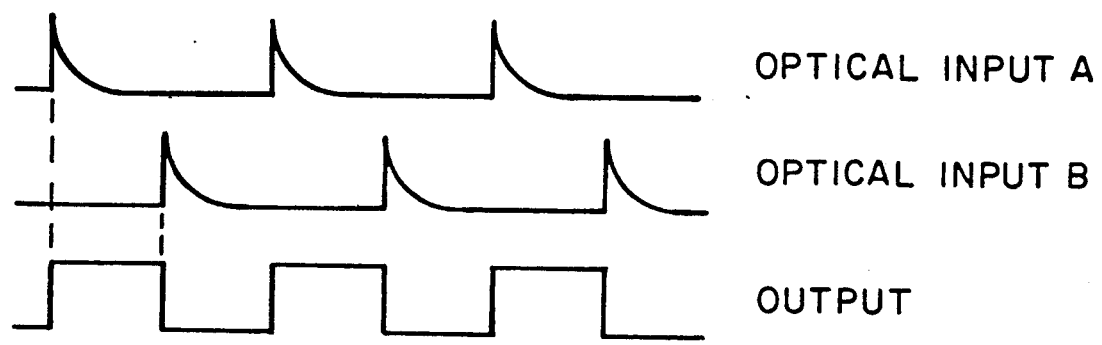
FIG. 6 illustrates graphically the OUTPUT signal changing state in response to the optical pulses applied to OPTICAL INPUTs A and B.

As shown in FIG. 6 an optical pulse applied to OPTICAL INPUT A sets OUTPUT logically HIGH, while an optical pulse applied to OPTICAL INPUT B resets the OUTPUT logically LOW. As was stated, electrical pulses could be substituted for some of the optical pulses or could be used to inhibit the operation of the optical pulses. The optical pulses may be derived from separate sources or from a common source. If the latter approach is employed one of the pulses is passed through an optical delay device, such as longer path length optical fiber, so that the second pulse is temporally offset from the first pulse by a desired amount. The amount of temporal offset affects the output electrical signal duty cycle as shown.

One significant advantage of directly coupling the light pulse to the gates of the transistors of the OPTOGLE 10 is the resulting simplicity of the circuit. That is, the MESFET itself functions as a photosensor and, with no signal amplifying or conditioning stage(s) required as with conventional types of optoelectronic devices, the propagation delay and the temporal jitter is minimized. Thus, the OPTOGLE 10 significantly reduces pulse skew characteristics which are especially critical in data processing clock signal distribution.

Figure 3:
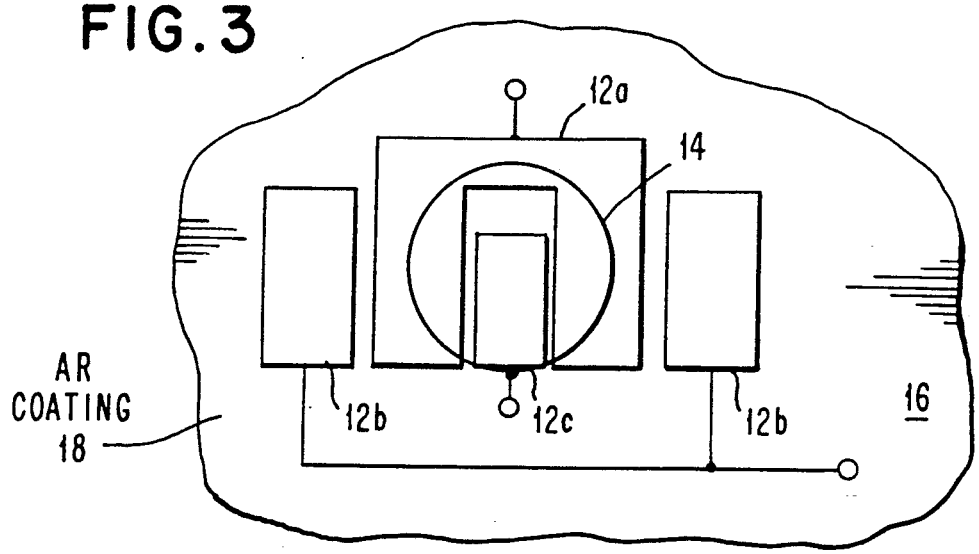
FIG. 3 illustrates the illumination of an interdigitated gate of a GaAs MESFET with an optical input signal for changing the state of the set-reset F/F of which the MESFET is a part.

The operation of the OPTOGLE 10 has been experimentally demonstrated with commercially available GaAs digital integrated circuits constructed with depletion-mode MESFETs. FIG. 3 illustrates an enlarged view of a portion of an interdigitated MESFET. In this device the gate electrode 12a is disposed between the source electrode 12b and the drain electrode 12c. An illuminating laser beam spot 14 has a diameter of approximately 30 microns. The interdigitated geometry of the gate electrode 12a beneficially reduces shadow effects of the electrodes, thus improving light coupling, while also providing for a low interelectrode capacitance. The provision of an anti-reflection (AR)-coating 18 over the gate electrode 12a further improves light coupling efficiency, the AR coating being optimized for the wavelength of the incident optical radiation. Coupling efficiency may be further improved with transistor gates constructed of semitransparent electrodes such as electrodes comprised of a relatively thin layer of metal having a thickness of approximately 100 Angstroms. In accordance with an aspect of the invention the MESFETs Q1 and Q2, associated electrodes 12a, 12b, 12c and other components are formed on a common substrate 16.

Figure 4:
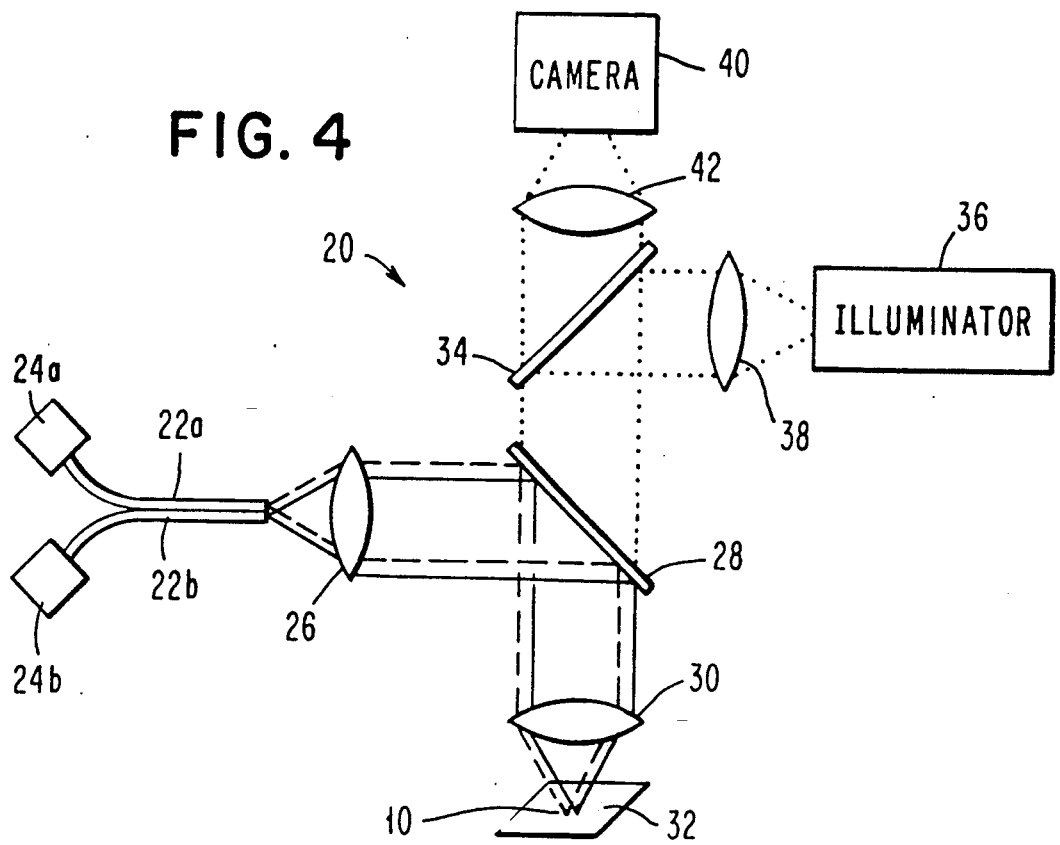
FIG. 4 is a block diagram illustrating experimental apparatus for coupling high speed optical pulses to the optical toggle circuit of the invention.

The characteristics of the GaAs OPTOGLE 10 were determined with the experimental apparatus 20 schematically shown in FIG. 4. The apparatus 20 includes a pair of optical fibers 22a and 22b each of which conveys light from an associated source 24a and 24b. Sources 24a and 24b are preferably each a coherent source. An output end of each the fibers 22 is coupled to a collimating lens 26 from which the light energy is relayed to a dichroic mirror 28. Optically coupled to one side of the dichroic mirror 28 is a focusing lens 30 for focusing the outputs of the sources 24 onto respective gate electrodes of an integrated circuit device 32 containing the OPTOGLE 10. Optically coupled to the opposite side of the dichroic mirror 28 is a beamsplitter 34. An illuminator 36 for camera 40 provides illumination through a collimating lens 36. Camera 40 views the scene through a focusing lens 42. This arrangement permits the optical stimulation of the OPTOGLE 10 and the simultaneous viewing by the camera 40.

Figure 5:
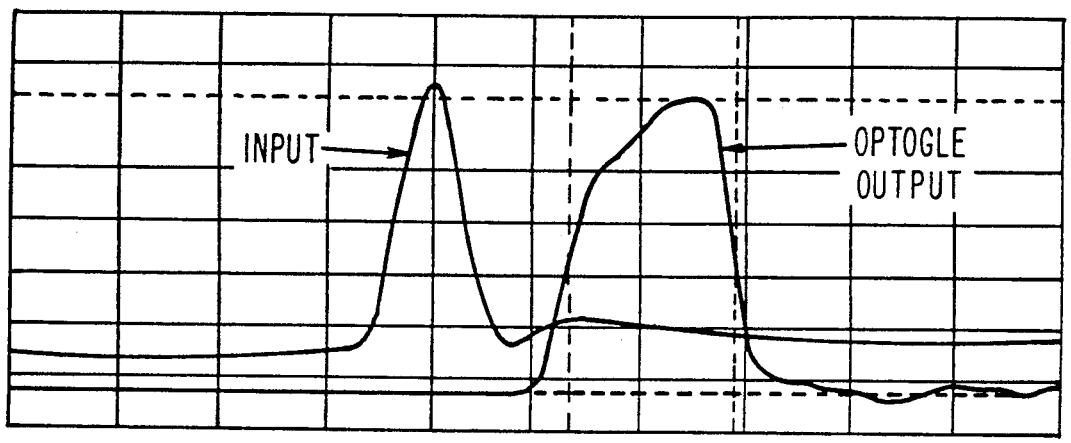
FIG. 5 illustrates graphically an output electrical pulse of the optical toggle circuit in response to an input optical pulse, the x-axis divisions each indicating 500 picoseconds ($500 \times 10^{-12}$ sec.)

FIG. 5 illustrates the OUTPUT signal of the OPTOGLE 10. Each time division along the x-axis represents 500 picoseconds. The input pulse is the input electrical pulse applied to a laser diode source in order to generate the optical pulse that was applied to the OPTOGLE 10.

Suitable sources of radiation include mode-locked Nd:Yag lasers, Nd:YLF lasers, AlGaAs diode lasers or any source capable of generating ultrashort, fast risetime, high-peak-power optical pulses at a high repetition rate. The wavelength of the pulse is preferably within a range of wavelengths strongly absorbed by the semiconductor material For example, both GaAs and silicon strongly absorb visible and near-infrared radiation. With known types of optical pulse compression techniques using optical fibers and gratings a duration of the optical pulses can be reduced to the sub-picosecond range. The GaAs MESFET-based OPTOGLE 10, although not entirely optimized for such operation, has been found to require a pulse energy of 4 pJoules. As an example, operation at 250 MHz requires an average optical power of 1 mWatt at each of the two OPTOGLE 10 receiving sites. Thus, a mode-locked laser with average output power of 1 Watt has sufficient power to simultaneously address approximately 500 of the OPTOGLE pulse converters. For example, the gate electrodes of two MESFET devices were illuminated with laser beam pulses having an approximately 30 micron spot size. The light pulses were produced by injecting a train of 250 picosecond electrical pulses into an AlGaAs diode laser having a nominal wavelength of 780 nanometers. The optical pulses were provided through fiber optics as depicted in FIG. 4.

Figure 8A:
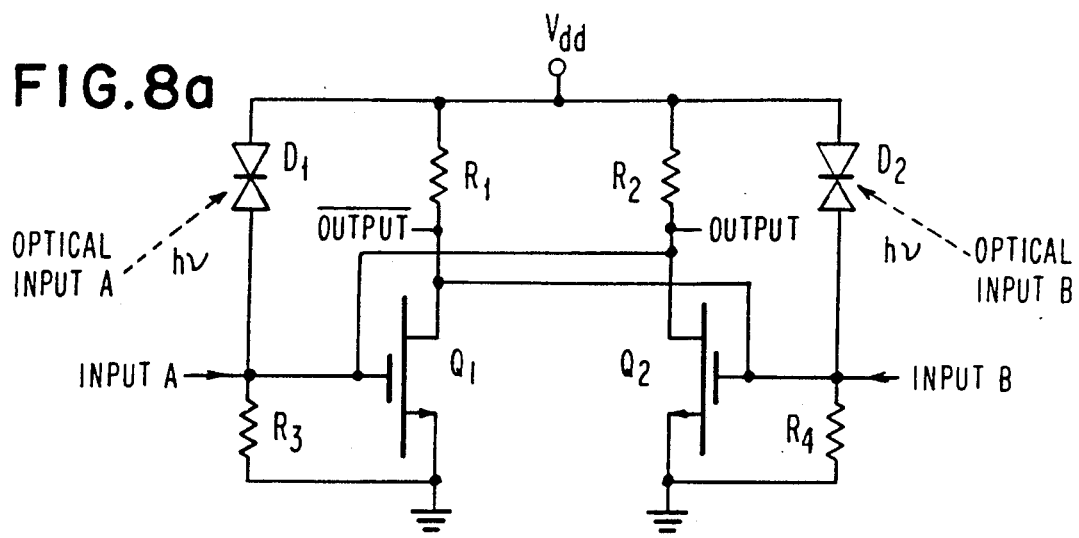
FIG. 8a is a schematic diagram of a toggle circuit implemented as a set-reset F/F and including integrated photodiodes for coupling first and the second optical inputs to associated switching transistors for changing the state of the F/F.

In addition to the photo-FET implementation described in detail above the SR-F/F may be implemented in various technologies. By example, FIG. 8a shows a FET flip-flop with photodiode inputs. Preferably, the photodiodes D1 and D2 are integrated into the same substrate as the FETs Q1 and Q2 and the other components of the SR-F/F. One important advantage of this technique is the reduction of required circuit dimensions with a corresponding reduction of stray circuit reactances, both capacitive and inductive, at the photosensor leads. As a result optical input pulses are efficiently received and circuit speeds are very fast. Of course, any of the SR-F/F embodiments may be implemented with bipolar transistor technology, instead of the FET technology shown.

Figure 9:
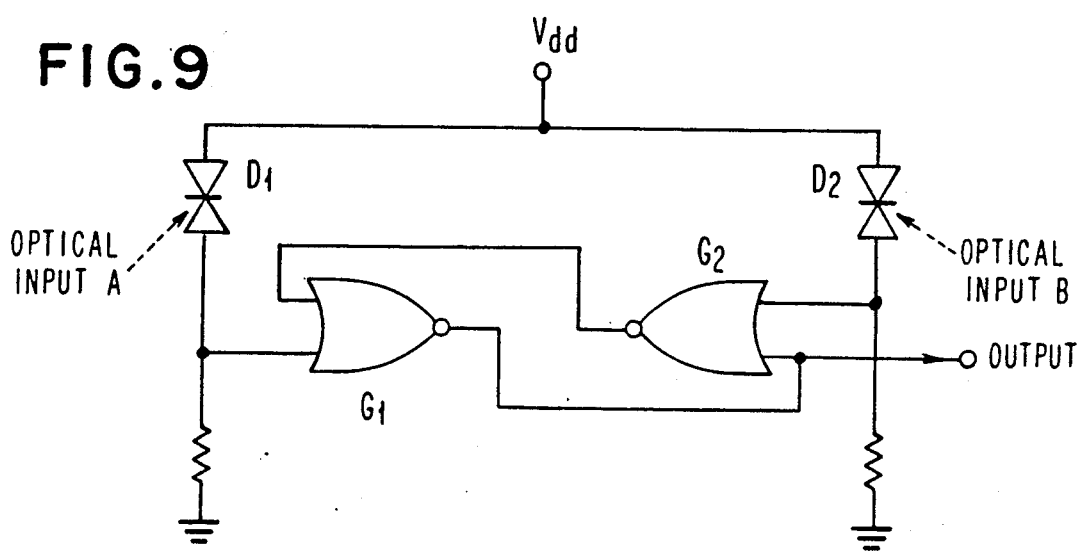
FIG. 9 is a schematic diagram of a toggle circuit implemented as a set-reset F/F including integrated photodiodes for coupling the optical inputs and further incorporating cross-coupled NOR-gate function devices in place of cross-coupled switching transistors.

Also, the SR-F/F may be implemented by more general logic devices, such as the NOR gates (G1 and G2) shown in FIG. 9. This embodiment also includes integrally formed photodiodes D1 and D2 and is implemented as an integrated photosensor/logic circuit combination to achieve fast switching times.

Figure 8B:
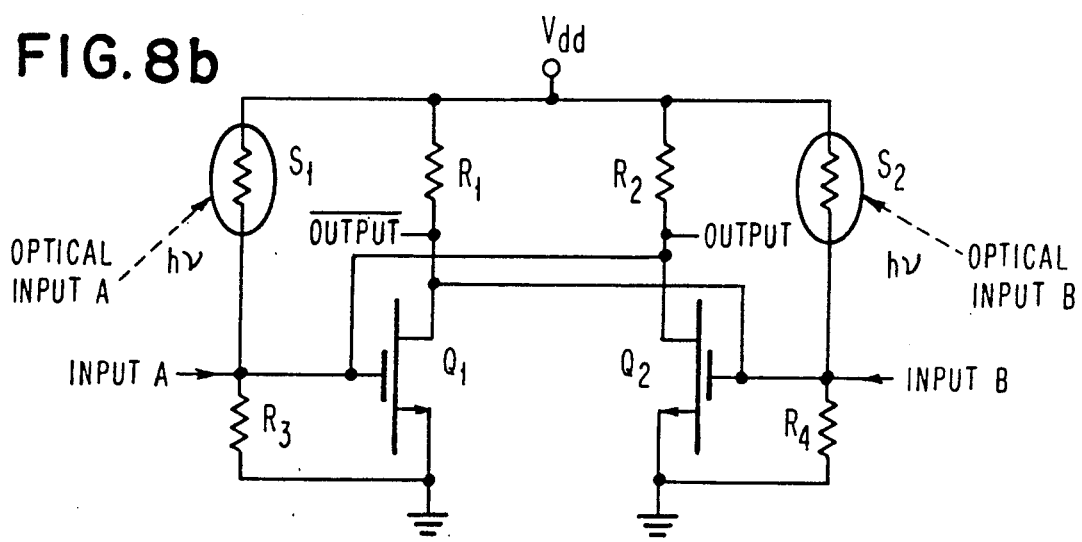
FIG. 8b is a schematic diagram of a toggle circuit implemented as a set-reset F/F and including integrated photoconductors for coupling first and the second optical inputs to associated switching transistors for changing the state of the F/F.

If desired, the use of photovoltaic optical sensors such as the photodiodes D1 and D2 may be replaced, as in FIG. 8b, by integrated photoconductive sensors (S1 and S2). Such devices, such as those constructed of Group III–V, silicon and other materials exhibit very fast (picosecond) response times and are well suited for this use.

In all embodiments of the invention an important aspect is the integration of the photosensor devices with the cross-coupled switching circuitry, with no additional amplifier circuits being required or deployed, thereby significantly reducing temporal jitter in the output pulse stream.

Figure 7A:
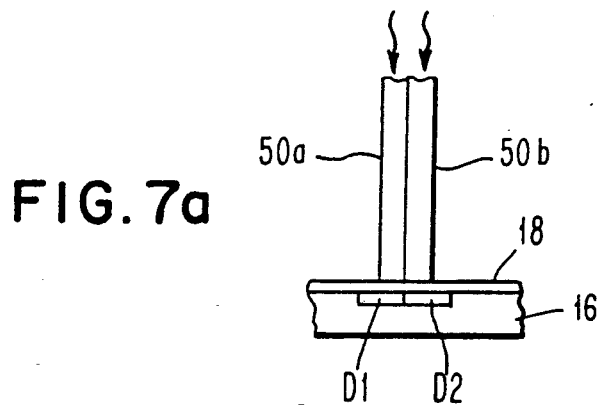
FIGS. 7a, 7b, 7c and 7d illustrate various methods for coupling optical pulses to inputs of the optical toggle circuit.
Figure 7B:
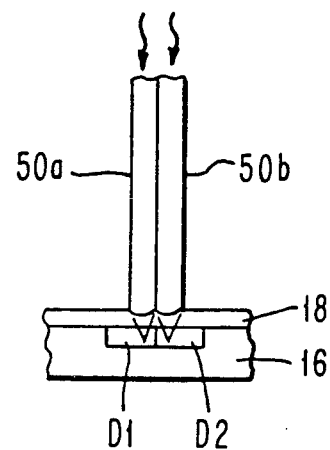
Figure 7C:
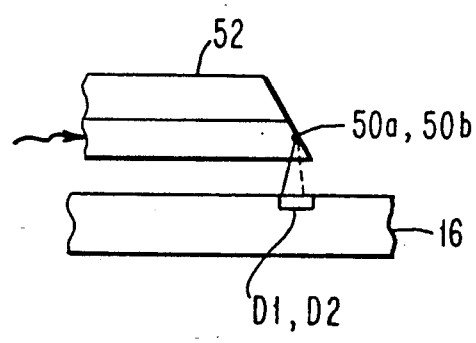
Figure 7D:
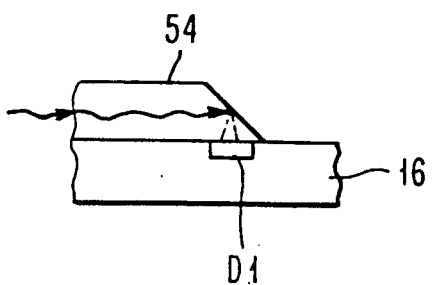

It should be noted that for application of the OPTOGLE to a data processor that the optical pulses may be applied, as depicted in FIGS. 7a–7d, through optical fibers 50a and 50b having flat, polished ends (FIG. 7a) or integral focusing optics (FIG. 7b). In these two embodiments the fiber 50a and 50b ends are bonded or otherwise fixedly coupled to the appropriate electrode region of each of the transistors Q1 and Q2 or to the associated one of the photodiodes D1 or D2 or photoconductors S1 or S2. Either single mode or multi-mode optical fibers are suitable for this task. FIG. 7c illustrates the fibers 50a and 50b having a beveled end and coupled to a v-block. The beveled fiber ends serve as reflectors for coupling the optical inputs to, for example, the photodetectors D1 and D2. FIG. 7d illustrates an optical waveguide 54 fabricated upon the substrate 16 and having an end in optical communication with the SR-F/F for coupling optical pulses thereto. It is also within the scope of the invention to convey the optical radiation to the transistors by integrating, for example, a plurality of AlGaAs laser devices onto an integrated circuit device with the OPTOGLE 10.

OPTOGLEs may be constructed with silicon FET technology although such devices exhibit a slower response due to relatively lower carrier mobility than similar devices constructed with GaAs and/or other Group III–V materials such as InP.

By example and referring to the embodiment of FIGS. 2 and 3 with GaAs material electron mobility is approximately 8600 cm$^2$/Vs and electron transit time is approximately 15 picoseconds for an electrode 12 spacing of five microns and an applied voltage of two volts.

The gain is approximately 10 for laser pulses of 150 picoseconds in duration. Modulation of the gate 12a voltage during operation also results in a current amplification.

Thus, while the invention has been particularly shown and described with respect to preferred embodiments thereof, it will be understood by those skilled in the art that changes in form and details may be made therein without departing from the scope and spirit of the invention.

Having thus described our invention, what we claim as new, and desire to secure by Letters Patent is:

1. Clock generator integrated circuit apparatus for generating a periodic electrical signal comprising:
   set-reset flip/flop means comprised of a first switching means and of a second switching means both of which are fabricated upon a common substrate, an output electrical terminal of the clock generator integrated circuit apparatus being coupled to an output terminal of one of the switching means; and
   means for receiving pulses of optical radiation integrally formed on the common substrate with each of the switching means, the receiving means comprising a first optical receiver means and a second optical receiver means each being coupled to an input of an associated one of the switching means for causing, in response to the receipt of a pulse of optical radiation by one of the optical receiver means, the associated switching means to toggle between an off-state and an on-state for generating a change of state of an electrical signal at the output electrical terminal of the clock generator integrated circuit apparatus.

2. Apparatus as set forth in claim 1 wherein each of the switching means is comprised of a transistor device fabricated from a semiconductor material having a characteristic energy bandgap for absorbing the optical pulse and generating sufficient charge carriers therefrom to induce a current flow through the transistor.

3. Apparatus as set forth in claim 2 wherein the semiconductor material is comprised of Group III–V material.

4. Apparatus as set forth in claim 2 wherein the semiconductor material is comprised of silicon.

5. Apparatus as set forth in claim 1 wherein the receiving means couples the associated switching means to an output of a pulsed laser source.

6. Apparatus as set forth in claim 5 and including fiber optic means for conveying the output of the laser source to the receiving means.

7. Apparatus as set forth in claim 5 and including optical waveguide means for conveying the output of the laser source to the receiving means.

8. Apparatus as set forth in claim wherein the receiving means is coupled to an output of a laser means.

9. Apparatus as set forth in claim 1 wherein each of the switching means is comprised of a field effect transistor (FET) device fabricated from a semiconductor material having a characteristic energy bandgap for absorbing the optical pulse and generating sufficient charge carriers therefrom to induce a current flow though the FET device, and wherein the receiving means comprises a gate terminal region of the FET device.

10. Apparatus as set forth in claim 9 wherein the gate terminal has an interdigitated geometry and is disposed adjacent to an anti-reflection coating.

11. Apparatus as set forth in claim 1 wherein each of the switching means is comprised of a field effect transistor (FET) device, and wherein the receiving means is comprised of a photovoltaic device coupled to a gate terminal of the FET device.

12. Apparatus as set forth in claim 1 wherein each of the switching means is comprised of a field effect transistor (FET) device, and wherein the receiving means is comprised of a photoconductive device coupled to a gate terminal of the FET device.

13. Apparatus as set forth in claim 1 wherein each of the switching means is comprised of a logic element.

14. Apparatus as set forth in claim 13 wherein the logic element has at least two inputs and operates in accordance with a NOR function.

15. Apparatus as set forth in claim 1 wherein the receiving means is coupled to an output of a pulsed laser source through an intervening optical waveguide means, and wherein the optical waveguide means is also integrally formed upon the common substrate.

16. Pulse conversion apparatus for converting an optical pulse into an electrical pulse, comprising:
   first transistor means having an output terminal coupled to an associated load means, the first transistor means further having a control terminal;
   second transistor means having an output terminal coupled to an associated load means, the second transistor means further having a control terminal, the first and the second transistor means being cross-coupled such that the control terminal of the first transistor means is coupled to the output terminal of the second transistor means and the control terminal of the second transistor means is coupled to the output terminal of the first transistor means, the output terminal of the first transistor means further being coupled to an output terminal of the pulse conversion apparatus, the first and the second transistor means each being fabricated upon a common substrate; and
   means for inputting pulses of optical radiation to the control terminal of the first transistor means and for inputting pulses of optical radiation to the control terminal of the second transistor means for causing the first and the second transistor means, in response to the receipt of a series of pulses of optical radiation by the inputting means, to toggle, for each received optical pulse, between a conducting state and a nonconducting state and for causing an electrical output signal appearing at the pulse conversion apparatus output terminal to toggle between a first logic state and a second logic state, the inputting means being integrally formed upon the common substrate with the first transistor means and the second transistor means for minimizing stray inductive and capacitive reactances for substantially eliminating temporal jitter of the electrical output signal.

17. Pulse conversion apparatus for converting an optical pulse into an electrical pulse, comprising:
   first transistor means having an output terminal coupled to an associated load means, the first transistor means further having a control terminal;
   second transistor means having an output terminal coupled to an associated load means, the second transistor means further having a control terminal, the first and the second transistor means being cross-coupled such that the control terminal of the first transistor means is coupled to the output terminal of the second transistor means and the control terminal of the second transistor means is coupled to the output terminal of the first transistor means, the output terminal of the first transistor means further being coupled to an output terminal of the pulse conversion apparatus, the first and the second transistor means each being fabricated upon a common substrate; and
   means for inputting pulses of optical radiation to the control terminal of the first transistor means and for inputting pulses of optical radiation to the control terminal of the second transistor means for causing the first and the second transistor means to alternately toggle between a conducting state and a nonconducting state and for causing an electrical output signal appearing at the pulse conversion apparatus output terminal to toggle between a first logic state and a second logic state, the inputting means being integrally formed upon the common substrate with the first transistor means and the second transistor means for minimizing stray inductive and capacitive reactances for substantially eliminating temporal jitter of the electrical output signal, wherein the inputting means is comprises of a first photodiode coupled to the control terminal of the first transistor means and a second photodiode coupled to the control terminal o the second transistor means.

18. Pulse conversion apparatus for converting an optical pulse into an electrical pulse, comprising:
   first transistor means having an output terminal coupled to an associated load means, the first transistor means further having a control terminal;
   second transistor means having an output terminal coupled to an associated load means, the second transistor means further having a control terminal, the first and the second transistor means being cross-coupled such that the control terminal of the first transistor means is coupled to the output terminal of the second transistor means and the control terminal of the second transistor means is coupled to the output terminal of the first transistor means, the output terminal of the first transistor means further being coupled to an output terminal of the pulse conversion apparatus, the first and the second transistor means each being fabricated upon a common substrate; and
   means for inputting pulses of optical radiation to the control terminal of the first transistor means and for inputting pulses of optical radiation to the control terminal of the second transistor means for causing the first and the second transistor means to alternately toggle between a conducting state and a nonconducting state and for causing an electrical output signal appearing at the pulse conversion apparatus output terminal to toggle between a first logic state and a second logic state, the inputting means being integrally formed upon the common substrate with the first transistor means and the second transistor means for minimizing stray inductive and capacitive reactances for substantially eliminating temporal jitter of the electrical output signal, wherein the inputting means is comprised of a first photoconductor coupled to the control terminal of the first transistor means and a second photoconductor coupled to the control terminal of the second transistor means.

19. Pulse conversion apparatus for converting an optical pulse into an electrical pulse, comprising:

first transistor means having an output terminal coupled to an associated load means, the first transistor means further having a control terminal;

second transistor means having an output terminal coupled to an associated load means, the second transistor means further having a control terminal, the first and the second transistor means being cross-coupled such that the control terminal of the first transistor means is coupled to the output terminal of the second transistor means and the control terminal of the second transistor means is coupled to the output terminal of the first transistor means, the output terminal of the first transistor means further being coupled to an output terminal of the pulse conversion apparatus, the first and the second transistor means each being fabricated upon a common substrate; and means for inputting pulses of optical radiation to the control terminal f the first transistor means and for inputting pulses of optical radiation to the control terminal of the second transistor means for causing the first and the second transistor means to alternately toggle between a conducting state and a nonconducting state and for causing an electrical output signal appearing at the pulse conversion apparatus output terminal to toggle between a first logic state and a second logic state, the inputting means being integrally formed upon the common substrate with the first transistor means and the second transistor means for minimizing stray inductive and capacitive reactances for substantially eliminating temporal jitter of the electrical output signal, wherein the inputting means is comprised of at least a portion of the control terminal of each of the first and the second transistor means.

20. Pulse conversion apparatus for converting an optical pulse into an electrical pulse, comprising:

first transistor means having an output terminal coupled to an associated load means, the first transistor means further having a control terminal;

second transistor means having an output terminal coupled to an associated load means, the second transistor means further having a control terminal, the first and the second transistor means being cross-coupled such that the control terminal of the first transistor means is coupled to the output terminal of the second transistor means and the control terminal of the second transistor means is coupled to the output terminal of the first transistor means, the output terminal of the first transistor means further being coupled to an output terminal of the pulse conversion apparatus, the first and the second transistor means each being fabricated upon a common substrate; and means for inputting pulses of optical radiation to the control terminal of the first transistor means and for inputting pulses of optical radiation to the control terminal of the second transistor means for causing the first and the second transistor means to alternately toggle between a conducting state and a nonconducting state and for causing an electrical output signal appearing at the pulse conversion apparatus output terminal to toggle between a first logic state and a second logic state, the inputting means being integrally formed upon the common substrate with the first transistor means and the second transistor means for minimizing stray inductive and capacitive reactances for substantially eliminating temporal jitter of the electrical output signal, wherein the first and the second transistor means each include a bipolar transistor or a field effect transistor comprised of silicon, germanium, Group III-V material or combinations thereof.

* * * * *

UNITED STATES PATENT AND TRADEMARK OFFICE
CERTIFICATE OF CORRECTION

PATENT NO. : 5,045,680

DATED : September 3, 1991

INVENTOR(S) : Bunsen Fan, and Ricky A. Rand

It is certified that error appears in the above-identified patent and that said Letters Patent is hereby corrected as shown below:

In Claim 8, col. 8, line 55 after "claim" insert --1--.

In Claim 17, col. 10, line 25 delete "comprises" and insert --comprised--.

In Claim 19, col. 11, line 22 delete "f" and insert --of--.

Signed and Sealed this

Fifth Day of January, 1993

Attest:

DOUGLAS B. COMER

*Attesting Officer*  *Acting Commissioner of Patents and Trademarks*